United States Patent
Mineji

[11] Patent Number: 5,915,196
[45] Date of Patent: Jun. 22, 1999

[54] METHOD OF FORMING SHALLOW DIFFUSION LAYERS IN A SEMICONDUCTOR SUBSTRATE IN THE VICINITY OF A GATE ELECTRODE

[75] Inventor: Akira Mineji, Tokyo, Japan

[73] Assignee: NEC Corporation, Tokyo, Japan

[21] Appl. No.: 08/746,486

[22] Filed: Nov. 12, 1996

[30] Foreign Application Priority Data

Nov. 10, 1995 [JP] Japan .................................. 7-292614

[51] Int. Cl.⁶ .................................................. H01L 21/336
[52] U.S. Cl. .......................... 438/526; 438/520; 438/305; 438/528
[58] Field of Search ..................... 438/520, 303, 438/526, 305, 528, 545, 546, 548, 549, 554, 555, 556, 914, 918, 921, FOR 313, FOR 314, FOR 309, FOR 310, FOR 316, FOR 318, FOR 158, FOR 160

[56] References Cited

U.S. PATENT DOCUMENTS

| | | | |
|---|---|---|---|
| 4,216,030 | 8/1980 | Graul et al. ............................. | 438/526 |
| 4,584,026 | 4/1986 | Wu et al. . | |
| 5,145,794 | 9/1992 | Kase et al. ............................. | 438/528 |
| 5,395,773 | 3/1995 | Ravindhran et al. ................... | 438/305 |
| 5,668,020 | 9/1997 | Lee ......................................... | 438/303 |

FOREIGN PATENT DOCUMENTS

| | | | |
|---|---|---|---|
| 1-196818 | 8/1989 | Japan ............................ | 438/FOR 158 |
| 5-13430 | 1/1993 | Japan . | |
| 5-190848 | 7/1993 | Japan ............................ | 438/FOR 158 |
| 6-29315 | 2/1994 | Japan ............................ | 438/FOR 158 |
| 6-77247 | 3/1994 | Japan ............................ | 438/FOR 158 |
| 6-89869 | 3/1994 | Japan ............................ | 438/FOR 158 |
| 6-89870 | 3/1994 | Japan ............................ | 438/FOR 158 |

OTHER PUBLICATIONS

S. Wolf, Silicon Processing for the VLSI Era, vol. II, pp. 436–437, Jun. 1990.

H.S. Chao et al., Appl. Phys. Lett., 68(25)(1996)3570 "Influence . . . amorphizing implants on . . . boron diffusion in silicon" Jun. 1996.

*Primary Examiner*—Charles Bowers
*Assistant Examiner*—Martin Sulsky
*Attorney, Agent, or Firm*—Young & Thompson

[57] ABSTRACT

A method of forming shallow diffusion layers in a semiconductor substrate is provided wherein the shallow diffusion layers are positioned in the vicinity of edge portions of a gate electrode and laterally extend from source/drain diffusion layers having a bottom level deeper than the shallow diffusion layers. The above method comprises the following steps. Crystal defects are selectively formed at least in predetermined shallow regions positioned in a surface region of the semiconductor substrate and in the vicinity of the edge portions of the gate electrode. The predetermined shallow regions are laterally in contact with impurity-introduced deep regions having been formed. The predetermined shallow regions have a bottom level shallower than the impurity-introduced deep regions. Subsequently, the semiconductor substrate is subjected to a heat treatment not only to cause a vertical diffusion of an impurity from the impurity-introduced regions so as to selectively form the source/drain diffusion layers but also to cause a rate-increased lateral diffusion of the impurity from the impurity-introduced regions through the predetermined shallow regions so as to selectively form the shallow diffusion layers.

66 Claims, 4 Drawing Sheets

METHOD OF FORMING SHALLOW DIFFUSION LAYERS IN A SEMICONDUCTOR SUBSTRATE IN THE VICINITY OF A GATE ELECTRODE

BACKGROUND OF THE INVENTION

The present invention relates to a method of forming shallow diffusion layers in a semiconductor substrate in the vicinity of a gate electrode in a MOS field effect transistor.

As the scaling down of the MOS field effect transistors are required, the problems with short channel effects are raised. In order to suppress the short channel effects, it is necessary to suppress a space charge region from extending under a gate electrode. In order to suppress the space charge region from extending under the gate electrode, it is required that source/drain diffusion layers are formed as shallow as possible.

In order to form shallow source/drain diffusion layers, it is necessary to settle the problems as follows. The first problem is that boron ion is likely to be implanted deeply into a silicon substrate due to channeling. The second problem is a rate-increased thermal diffusion of boron during a heat treatment to the silicon substrate.

In order to solve the above problems, it was proposed that Si or B ion be previously implanted into source/drain regions to make the surface of the silicon substrate amorphous to suppress channeling from appearing in the subsequent ion-implantation of B or $BF_2$ to form p-type diffusion layers. This technique is disclosed, for example, the Japanese laid-open patent application No. 63-155720.

It was also proposed that Si or B ion be previously implanted into not only source/drain regions but also under gate electrode side walls to make the surface of the silicon substrate amorphous to suppress channeling from appealing in the subsequent ion-implantation of B or $BF_2$ to form p-type diffusion layers. This technique is disclosed, for example, the Japanese laid-open patent application No. 4-158529.

The above techniques have the following problems. As the gate length is required to be reduced to 0.2 micrometers or less, the junction depth of the diffusion layers is required to be reduced to 0.15 micrometer or less. Actually, however, there is another problem with difficulty to form contacts on such extremely shallow diffusion layers due to penetration of contact metals through the shallow diffusion layers which leads to increase. both in contact resistance and in leakage of current. There is raised still another problem with increased resistance of the diffusion layers which leads to a drop of the ON-current. There is raised yet another problem with a difficulty to form silicide layers over the source/drain diffusion layers for the purpose of reduction in resistance of the source/drain diffusion layers. In order to form silicide layers having a sufficiently reduced resistance, it is required that a refractory metal layer, be formed over source/drain diffusion silicon layers for subsequent reaction of refractory metal with silicon. The silicidation reaction makes the source/drain diffusion layers thin. If the source/drain diffusion silicon layers are extremely shallow, the silicidation reaction makes the source/drain diffusion layers extremely thin which causes increased junction resistance of the silicide layer with the source/drain diffusion layers. It is difficult to form the silicide layers of a uniform and reduced thickness with a reduced resistance.

To settle the above problem, it was proposed to form shallow diffusion layers extending under gate electrode side walls and adjacent to source and drain diffusion regions relatively deep. This is disclosed in the Japanese laid-open patent application No. 62-176166 and a device structure is illustrated in FIG. 1. Source and drain diffusion layers 30 have extending shallow diffusion layers 29 positioned under side walls 26 of a gate electrode 24.

The above third conventional technique also has different problems. Since the shallow diffusion layers are formed by ion-implantation of p-type impurity, there is a limitation to make the diffusion layers as shallow as required above when the thickness of the shallow diffusion layers is required to be about 0.1 micrometers or less.

In the above circumstances, it is required to develop a quite novel and improved method of forming shallow diffusion layers positioned under the gate side walls to make the above transistor free from the above problems and from the problems with the short channel effects described above.

SUMMARY OF THE INVENTION

Accordingly, it is an object of the present invention to provide a novel method of forming shallow diffusion layers in a semiconductor substrate in the vicinity of a gate electrode in a MOS field effect transistor free from any problems and disadvantages as described above.

It is a further object of the present invention to provide a novel method of forming shallow diffusion layers in a semiconductor substrate in the vicinity of a gate electrode in a MOS field effect transistor free from any short channel effects.

It is a still further object of the present invention to provide a novel method of forming shallow diffusion layers in a semiconductor substrate in the vicinity of a gate electrode in a MOS field effect transistor with high performances.

It is yet a further object of the present invention to provide a novel method of forming shallow diffusion layers in a semiconductor substrate in the vicinity of a gate electrode in a MOS field effect transistor with source/drain diffusion layers having a reduced resistance.

It is a further more object of the present invention to provide a novel method of forming shallow diffusion layers in a semiconductor substrate in the vicinity of a gate electrode in a MOS field effect transistor suitable for facilitating a silicide formation.

It is moreover object of the present invention to provide a novel method of forming shallow $p^+$-diffusion layers in a silicon substrate in the vicinity of a gate electrode in a MOS field effect transistor.

It is still more object of the present invention to provide a novel method of forming shallow diffusion layers in a semiconductor substrate in the vicinity of a gate electrode in a MOS field effect transistor, which comprises a reduced number of processes therefor.

It is another object of the present invention to provide a novel method of forming a p-channel MOS field effect transistor with shallow diffusion layers free from any problems and disadvantages as described above.

It is further another object of the present invention to provide a novel method of forming a p-channel MOS field effect transistor with shallow diffusion layers free from any short channel effects.

It is a still another object of the present invention to provide a novel method of forming a p-channel MOS field effect transistor with shallow diffusion layers with high performances.

It is yet another object of the present invention to provide a novel method of forming a p-channel MOS field effect transistor with shallow diffusion layers and source/drain diffusion layers having a reduced resistance.

It is an additional object of the present invention to provide a novel method of forming a p-channel MOS field effect transistor with shallow diffusion layers suitable for facilitating a silicide formation.

It is an additional object of the present invention to provide a novel method of forming a p-channel MOS field effect transistor with shallow $p^+$-diffusion layers.

It is still more an object of the present invention to provide a novel method of forming a p-channel MOS field effect transistor with shallow diffusion layers, which comprises a reduced number of processes therefor.

The first present invention provides a method of forming shallow diffusion layers in a semiconductor substrate. The shallow diffusion layers are positioned in the vicinity of edge portions of a gate electrode. The shallow diffusion layers laterally extend from source/drain diffusion layers having a bottom level deeper than the shallow diffusion layers. The method of forming said shallow diffusion layers comprises the following steps. Crystal defects are selectively formed at least in predetermined shallow regions positioned in a surface region of the semiconductor substrate and in the vicinity of the edge portions of the gate electrode. The predetermined shallow regions are laterally in contact with impurity-introduced deep regions having been formed. The predetermined shallow regions have a bottom level shallower than the impurity-introduced deep regions. Subsequently, the semiconductor substrate is subjected to a heat treatment not only to cause a vertical diffusion of an impurity from the impurity-introduced regions so as to selectively form the source/drain diffusion layers but also to cause a rate-increased lateral diffusion of the impurity from the impurity-introduced regions through the predetermined shallow regions so as to selectively form the shallow diffusion layers.

The second present invention also provides a method of forming shallow diffusion layers in a semiconductor substrate. The shallow diffusion layers are positioned in the vicinity of edge portions of a gate electrode. The shallow diffusion layers laterally extend from source/drain diffusion layers having a bottom level deeper than the shallow diffusion layers. The method of forming the shallow diffusion layers comprises the following steps. Crystal defects are selectively formed at least in predetermined shallow regions positioned in a surface region of the semiconductor substrate and in the vicinity of the edge portions of the gate electrode. Subsequently, impurity-introduced deep regions are selectively formed laterally in contact with the predetermined shallow regions. The impurity-introduced deep regions have a bottom level deeper than the predetermined shallow regions. Thereafter, the semiconductor substrate is subjected to a heat treatment not only to cause a vertical diffusion of an impurity from the impurity-introduced regions so as to selectively form the source/drain diffusion layers but also to cause a rate-increased lateral diffusion of the impurity from the impurity-introduced regions through the predetermined shallow regions so as to selectively form the shallow diffusion layers.

The third present invention provides a method of forming a MOS field effect transistor comprising the following steps. A gate electrode is selectively formed on a gate insulation film which is formed on a surface of a silicon substrate. Crystal defects are selectively formed in predetermined shallow regions positioned in a surface region of the semiconductor substrate by using the gate electrode as a mask. Side wall oxide films are selectively formed at opposite sides of the gate electrode. Impurity-introduced deep regions having a bottom level deeper than the predetermined shallow regions are selectively formed by an ion implantation using the gate electrode and the side wall oxide films as masks. The semiconductor substrate is subjected to a heat treatment not only to cause a vertical diffusion of an impurity from the impurity-introduced regions so as to selectively form source/drain diffusion layers but also to cause a rate-increased lateral diffusion of the impurity from the impurity-introduced regions through the predetermined shallow regions so as to selectively form shallow diffusion layers in the semiconductor substrate under the side wall oxide films, so that the shallow diffusion layers laterally extend from the source/drain diffusion layers and that the shallow diffusion layers have a bottom level shallower than the source/drain diffusion layers.

The fourth present invention also provides a method of forming a MOS field effect transistor comprising the following steps. A gate electrode is selectively formed on a gate insulation film which is formed on a surface of a silicon substrate. Side wall oxide films are selectively formed at opposite sides of the gate electrode. Impurity-introduced deep regions are selectively formed by an ion implantation using the gate electrode and the side wall oxide films as masks. The side wall oxide films are removed. Crystal defects are selectively formed in predetermined shallow regions positioned in a surface region of the semiconductor substrate by using the gate electrode as a mask. The predetermined shallow regions have a bottom level shallower than the impurity-introduced deep regions. The semiconductor substrate is subjected to a heat treatment not only to cause a vertical diffusion of an impurity from the impurity-introduced regions so as to selectively form source/drain diffusion layers but also to cause a rate-increased lateral diffusion of the impurity from the impurity-introduced regions through the predetermined shallow regions so as to selectively form shallow diffusion layers in the semiconductor substrate under the side wall oxide films, so that the shallow diffusion layers laterally extend from the source/drain diffusion layers and that the shallow diffusion layers have a bottom level shallower than the source/drain diffusion layers.

The fifth present invention also provides a method of forming a MOS field effect transistor comprising the following steps. A gate electrode is selectively formed on a gate insulation film which is formed on a surface of a silicon substrate. Side wall oxide films are selectively formed at opposite sides of the gate electrode. Impurity-introduced deep regions are selectively formed by an ion implantation using the gate electrode and the side wall oxide films as masks. Crystal defects are selectively formed in predetermined shallow and deep regions by such an ion-implantation of silicon as to have silicon atoms penetrate through the gate electrode and the side wall oxide films. The predetermined shallow region is positioned in a surface region of the semiconductor substrate under the gate electrode and the side wall oxide films. The predetermined shallow region have a bottom shallower than the impurity-introduced deep regions. The predetermined deep regions have bottoms positioned under the impurity-introduced deep regions. The semiconductor substrate is subjected to a heat treatment not only to cause a rate-increased vertical diffusion of an impurity from the impurity-introduced regions through the predetermined deep regions so as to selectively form source/drain diffusion layers but also to cause a rate-increased lateral diffusion of the impurity from the impurity-introduced regions through the predetermined shallow region so as to selectively form shallow diffusion layers in the semiconductor substrate under the side wall oxide films, so that the shallow diffusion layers laterally extend from the source/drain diffusion layers and that the shallow diffusion layers have a bottom level shallower than the source/drain diffusion layers.

The sixth present invention also provides a method of forming a MOS field effect transistor comprising the following steps. A gate electrode is selectively formed on a gate insulation film which is formed on a surface of a silicon substrate. Side wall oxide films are selectively formed at opposite sides of the gate electrode. Impurity-introduced deep regions self-aligned are selectively formed by using the gate electrode and the side wall oxide films as masks. Source/drain diffusion layers are formed by activating the impurity-introduced deep regions. Crystal defects are selectively formed both in a predetermined shallow region and in the source/drain diffusion layers by such an ion-implantation of silicon as to have silicon atoms penetrate through the gate electrode and the side wall oxide films. The predetermined shallow region is positioned in a surface region of the semiconductor substrate under the gate electrode and the side wall oxide films. The predetermined shallow region have a bottom shallower than the source/drain diffusion layers. The semiconductor substrate is subjected to a heat treatment not only to cause a vertical diffusion of an impurity from the source/drain diffusion regions but also to cause a rate-increased lateral diffusion of the impurity from the source/drain diffusion layers through the predetermined shallow region so as to selectively form shallow diffusion layers in the semiconductor substrate under the side wall oxide films, so that the shallow diffusion layers laterally extend from the source/drain diffusion layers and that the shallow diffusion layers have a bottom level shallower than the source/drain diffusion layers.

The seventh present invention also provides a method of forming a MOS field effect transistor comprising the following steps. A gate electrode is selectively formed on a gate insulation film which is formed on a surface of a silicon substrate. Side wall oxide films are selectively formed at opposite sides of the gate electrode. Impurity-introduced silicon films self-aligned is selectively formed on the silicon substrate by using the gate electrode and the side wall oxide films as masks. Crystal defects are selectively formed in predetermined shallow and deep regions by such an ion-implantation of silicon as to have silicon atoms penetrate through the gate electrode and the side wall oxide films. The predetermined shallow region is positioned in a surface region of the semiconductor substrate under the gate electrode and the side wall oxide films. The predetermined deep regions have a bottom level deeper than the predetermined shallow region. The semiconductor substrate is subjected to a heat treatment not only to cause a rate-increased vertical diffusion of an impurity from the impurity-introduced silicon films through the predetermined deep regions so as to selectively form source/drain diffusion layers but also to cause a rate-increased lateral diffusion of the impurity from the impurity-introduced silicon films through the predetermined deep and shallow regions so as to selectively form shallow diffusion layers in the semiconductor substrate under the side wall oxide films, so that the shallow diffusion layers laterally extend from lower portions of the source/drain diffusion layers and that the shallow diffusion layers have a bottom level shallower than the source/drain diffusion layers.

BRIEF DESCRIPTIONS OF THE DRAWINGS

Preferred embodiments of the present invention will be described in detail wish reference to the accompanying drawings.

DISCLOSURE OF THE INVENTION

Figure 1:
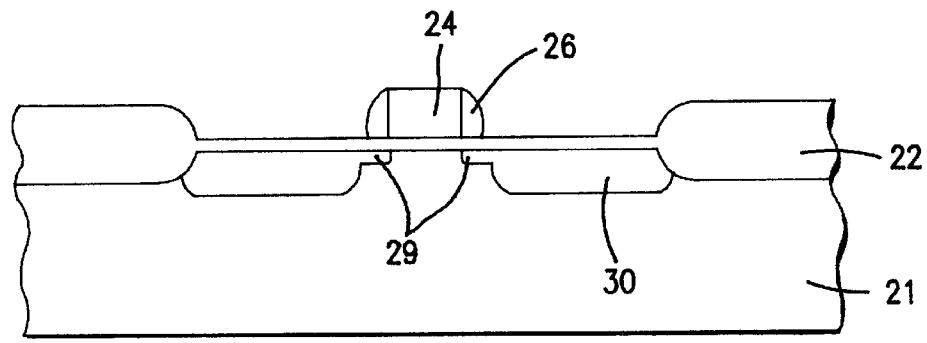
FIG. 1 is a fragmentary cross sectional elevation view illustrative of an n-channel MOS field effect transistor with the conventional diffusion layer structure.

The first present invention provides a method of forming shallow diffusion layers in a semiconductor substrate. The shallow diffusion layers are positioned in the vicinity of edge portions of a gate electrode. The shallow diffusion layers laterally extend from source/drain diffusion layers having a bottom level deeper than the shallow diffusion layers. The method of forming said shallow diffusion layers comprises the following steps. Crystal defects are selectively formed at least in predetermined shallow regions positioned in a surface region of the semiconductor substrate and in the vicinity of the edge portions of the gate electrode. The predetermined shallow regions are laterally in contact with impurity-introduced deep regions having been formed. The predetermined shallow regions have a bottom level shallower than the impurity-introduced deep regions. Subsequently, the semiconductor substrate is subjected to a heat treatment not only to cause a vertical diffusion of an impurity from the impurity-introduced regions so as to selectively form the source/drain diffusion layers but also to cause a rate-increased lateral diffusion of the impurity from the impurity-introduced regions through the predetermined shallow regions so as to selectively form the shallow diffusion layers.

The crystal defects may be formed by subjecting the substrate to a plasma atmosphere.

The crystal defects may be formed by an ion-implantation at a dose slightly lower than a critical dose over which crystal semiconductor is made into amorphous semiconductor.

The semiconductor substrate may be a silicon substrate and the crystal defects may be formed by an ion-implantation of silicon into the silicon substrate.

It is required that the ion-implantation of silicon be carried out at a dose lower than a critical dose over which crystal silicon is made into amorphous silicon. The ion-implantation of silicon is preferably carried out at a dose in the range of $1\times10^{13}$ cm$^{-2}$ to $5\times10^{14}$ cm$^{-2}$, and more preferably at a dose of about $1\times10^{14}$ cm$^{-2}$. As the dose of silicon for introducing the crystal defects is increased, the diffusion length or the diffusion rate is increased. If, however, the surface of the semiconductor substrate is made into amorphous state, then the diffusion length drops. This means that increase in the density of crystal defects renders the rate of impurity diffusion increased unless the semiconductor is made into amorphous state.

The semiconductor substrate may be a silicon substrate and the crystal defects may be formed by subjecting the surface of the silicon substrate to an ion-implantation to cause interstitial silicon atoms. The ion may be selected from the group consisting of Ge, N, F, Sb, In, P, As, Ga, He, Ne and Ar. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

The heat treatment may be carried out at a temperature in the range of 700–900° C. Alternatively, the heat treatment may be a rapid thermal anneal carried out at a temperature in the range of 900–1150° C. to shorten the time of the anneal.

It is preferable that the shallow diffusion layers have a depth in the range of 10–70 nanometers. The junction depth of the shallow diffusion layers is defined by the depth of the predetermined shallow regions into which crystal defects are introduced. The depth of the predetermined shallow regions is controllable by controlling the ion implantation energy, for which reason the junction depth of the shallow diffusion layers is controllable by controlling the ion implantation energy. The junction depth of the shallow diffusion layers is determined as shallow as possible, however, in consideration of the issue of increased resistance of the shallow diffusion layers.

The second present invention also provides a method of forming shallow diffusion layers in a semiconductor substrate. The shallow diffusion layers are positioned in the vicinity of edge portions of a gate electrode. The shallow diffusion layers laterally extend from source/drain diffusion layers having a bottom level deeper than the shallow diffusion layers. The method of forming the shallow diffusion layers comprises the following steps. Crystal defects are selectively formed at least in predetermined shallow regions positioned in a surface region of the semiconductor substrate and in the vicinity of the edge portions of the gate electrode. Subsequently, impurity-introduced deep regions are selectively formed laterally in contact with the predetermined shallow regions. The impurity-introduced deep regions have a bottom level deeper than the predetermined shallow regions. Thereafter, the semiconductor substrate is subjected to a heat treatment not only to cause a vertical diffusion of an impurity from the impurity-introduced regions so as to selectively form the source/drain diffusion layers but also to cause a rate-increased lateral diffusion of the impurity from the impurity-introduced regions through the predetermined shallow regions so as to selectively form the shallow diffusion layers.

The crystal defects may be formed by subjecting the substrate to a plasma atmosphere.

Alternatively, the crystal defects may be formed by an ion-implantation at a dose slightly lower than a critical dose over which crystal semiconductor is made into amorphous semiconductor.

The semiconductor substrate may be a silicon substrate and the crystal defects may be formed by an ion-implantation of silicon into the silicon substrate. It is preferable that the ion-implantation of silicon is carried out at a dose lower than a critical dose over which crystal silicon is made into amorphous silicon. It is Other preferable that the ion-implantation of silicon is carried out at a dose in the range of $1\times10^{13}$ cm$^{-2}$ to $5\times10^{14}$ cm$^{-2}$. It is most preferable that the ion-implantation of silicon is carried out at a dose of about $1\times10^{14}$ cm$^{-2}$. As the dose of silicon for introducing the crystal defects is increased, the diffusion length or the diffusion rate is increased. If, however, the surface of the semiconductor substrate is made into amorphous state, then the diffusion length drops This means that increase in the density of crystal defects renders the rate of impurity diffusion increased unless the semiconductor is made into amorphous state.

The semiconductor substrate may be a silicon substrate and the crystal defects may alternatively be formed by subjecting the surface of the silicon substrate to an ion-implantation to cause interstitial silicon atoms. The ion may be selected from the group consisting of Ge, N, F, Sb, In, P, As, Ga, He, Ne and Ar. The flicked silicon atoms do form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

The heat treatment may be carried out at a temperature in the range of 700–900° C. Alternatively, the heat treatment may be a rapid thermal anneal carried out at a temperature in the range of 900–1150° C. to shorten the time of the anneal.

It is preferable that the shallow diffusion layers have a depth in the range of 10–70 nanometers. The junction depth of the shallow diffusion layers is defined by the depth of the predetermined shallow regions into which crystal defects are introduced. The depth of the predetermined shallow regions is controllable by controlling the ion implantation energy, for which reason the junction depth of the shallow diffusion layers is controllable by controlling the ion implantation energy. The junction depth of the shallow diffusion layers is determined as shallow as possible, however, in consideration of the issue of increased resistance of the shallow diffusion layers.

The third present invention provides a method of forming a MOS field effect transistor comprising the following steps. A gate electrode is selectively formed on a gate insulation film which is formed on a surface of a silicon substrate. Crystal defects are selectively formed in predetermined shallow regions positioned in a surface region of the semiconductor substrate by using the gate electrode as a mask. Side wall oxide films are selectively formed at opposite sides of the gate electrode. Impurity-introduced deep regions having a bottom level deeper than the predetermined shallow regions are selectively formed by an ion implantation using the gate electrode and the side wall oxide films as masks. The semiconductor substrate is subjected to a heat treatment not only to cause a vertical diffusion of an impurity from the impurity-introduced regions so as to selectively form source/drain diffusion layers but also to cause a rate-increased lateral diffusion of the impurity from the impurity-introduced regions through the predetermined shallow regions so as to selectively form shallow diffusion layers in the semiconductor substrate under the side wall oxide films, so that the shallow diffusion layers laterally extend from the source/drain diffusion layers and that the shallow diffusion layers have a bottom level shallower than the source/drain diffusion layers.

The side wall oxide films are required to be formed at a temperature below a critical temperature over which the crystal defects are recovered. The side wall oxide films are formed, for example, at a temperature in the range of 200–450° C.

The crystal defects may be formed by subjecting the substrate to a plasma atmosphere.

Alternatively, the crystal defects may be formed by an ion-implantation at a dose slightly lower than a critical dose over which crystal semiconductor is made into amorphous semiconductor. The crystal defects may be formed by an ion-implantation of silicon into the silicon substrate. The ion-implantation of silicon is preferably carried out at a dose in the range of $1 \times 10^{13}$ cm$^{-2}$ to $5 \times 10^{14}$ cm$^{-2}$. It is more preferable that the ion-implantation of silicon is carried out at a dose of about $1 \times 10^{14}$ cm$^{-2}$. As the dose of silicon for introducing the crystal defects is increased, the diffusion length or the diffusion rate is increased. If, however, the surface of the semiconductor substrate is made into amorphous state, then the diffusion length drops. This means that increase in the density of crystal defects renders the rate of impurity diffusion increased unless the semiconductor is made into amorphous state.

Alternatively, the crystal defects may be formed by subjecting the surface of the silicon substrate to an ion-implantation to cause interstitial silicon atoms. The ion may be selected from the group consisting of Ge, N, F, Sb, In, P, As, Ga, He, Ne and Ar. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

The heat treatment may be carried out at a temperature in the range of 700–900° C. Alternatively, the heat treatment may be a rapid thermal anneal carried out at a temperature in the range of 900–1150° C. to shorten the time of the anneal.

It is preferable that the shallow diffusion layers have a depth in the range of 10–70 nanometers. The junction depth of the shallow diffusion layers is defined by the depth of the predetermined shallow regions into which crystal defects are introduced. The depth of the predetermined shallow regions is controllable by controlling the ion implantation energy, for which reason the junction depth of the shallow diffusion layers is controllable by controlling the ion implantation energy. The junction depth of the shallow diffusion layers is determined as shallow as possible, however, in consideration of the issue of increase in resistance of the shallow diffusion layers.

The fourth present invention also provides a method of forming a MOS field effect transistor comprising the following steps. A gate electrode is selectively formed on a gate insulation film which is formed on a surface of a silicon substrate. Side wall oxide films are selectively formed at opposite sides of the gate electrode. Impurity-introduced deep regions are selectively formed by an ion implantation using the gate electrode and the side wall oxide films as masks. The side wall oxide films are removed. Crystal defects are selectively formed in predetermined shallow regions positioned in a surface region of the semiconductor substrate by using the gate electrode as a mask. The predetermined shallow regions have a bottom level shallower than the impurity-introduced deep regions. The semiconductor substrate is subjected to a heat treatment not only to cause a vertical diffusion of an inpurity from the impurity-introduced regions so as to selectively form source/drain diffusion layers but also to cause a rate-increased lateral diffusion of the impurity from the impurity-introduced regions through the predetermined shallow regions so as to selectively form shallow diffusion layers in the semiconductor substrate under the side wall oxide films, so that the shallow diffusion layers laterally extend from the source/drain diffusion layers and that the shallow diffusion layers have a bottom level shallower than the source/drain diffusion layers The crystal defects may be formed by subjecting the substrate to a plasma atmosphere.

The crystal defects may be formed by an ion-implantation at a dose slightly lower than a critical dose over which crystal semiconductor is made into amorphous semiconductor. The crystal defects may be formed by an ion-implantation of silicon into the silicon substrate. The ion-implantation of silicon is preferably carried out at a dose in the range of $1 \times 10^{13}$ cm$^{-2}$ to $5 \times 10^{14}$ cm$^{-2}$. It is more preferable that the ion-implantation of silicon is carried out at a dose of about $1 \times 10^{14}$ cm$^{-2}$. As the dose of silicon for introducing the crystal defects is increased, the diffusion length or the diffusion rate is increased. If, however, the surface of the semiconductor substrate is made into amorphous state, then the diffusion length drops. This means that increase in the density of crystal defects renders the rate of impurity diffusion increased unless the semiconductor is made into amorphous state.

Alternatively, the crystal defects may be formed by subjecting the surface of the silicon substrate to an ion-implantation to cause interstitial silicon atoms. The ion may be selected from the group consisting of Ge, N, F, Sb, In, P, As, Ga, He, Ne and Ar. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

The heat treatment may be carried out at a temperature in the range of 700–900° C. Alternatively, the heat treatment may be a rapid thermal anneal carried out at a temperature in the range of 900–1150° C. to shorten the time of the anneal.

It is preferable that the shallow diffusion layers have a depth in the range of 10–70 nanometers. The junction depth of the shallow diffusion Layers is defined by the depth of the predetermined shallow regions into which crystal defects are introduced. The depth of the predetermined shallow regions is controllable by controlling the ion implantation energy, for which reason the junction depth of the shallow diffusion layers is controllable by controlling the ion implantation energy. The junction depth of the shallow diffusion layers is determined as shallow as possible, however, in consideration of the issue of increased resistance of the shallow diffusion layers.

The fifth present invention also provides a method of forming a MOS field effect transistor comprising the following steps. A gate electrode is selectively formed on a gate insulation film which is formed on a surface of a silicon substrate. Side wall oxide films are selectively formed at opposite sides of the gate electrode. Impurity-introduced deep regions are selectively formed by an ion implantation using the gate electrode and the side wall oxide films as masks. Crystal defects are selectively formed in predetermined shallow and deep regions by such an ion-implantation of silicon as to have silicon atoms penetrate through the gate electrode and the side wall oxide films. The predetermined shallow region is positioned in a surface region of the semiconductor substrate under the gate electrode and the side wall oxide films. The predetermined shallow region have a bottom shallower than the impurity-introduced deep regions. The predetermined deep regions have bottoms positioned under the impurity-introduced deep regions. The semiconductor substrate is subjected to a heat treatment not only to cause a rate-increased vertical diffusion of an impurity from the impurity-introduced regions through the predetermined deep regions so as to selectively form source/drain diffusion layers but also to cause a rate-increased lateral diffusion of the impurity from the impurity-introduced regions through the predetermined shallow region so as to selectively form shallow diffusion layers in the semiconductor substrate under the side wall oxide films, so that the shallow diffusion layers laterally extend from the source/drain diffusion layers and that the shallow diffusion layers have a bottom level shallower than the source/drain diffusion layers.

The crystal defects may be formed by an ion-implantation at a dose slightly lower than a critical dose over which crystal semiconductor is made into amorphous semiconductor. The ion-implantation of silicon is preferably carried out at a dose in the range of $1\times10^{13}$ cm$^{-2}$ to $5\times10^{14}$ cm$^{-2}$. It is more preferable that the ion-implantation of silicon is carried out at a dose of about $1\times10^{14}$ cm$^{-2}$. As the dose of silicon for introducing the crystal defects is increased, the diffusion length or the diffusion rate is increased. If, however, the surface of the semiconductor substrate is made into amorphous state, then the diffusion length drops. This means that increase in the density of crystal defects renders the rate of impurity diffusion increased unless the semiconductor is made into amorphous state.

The crystal defects may be formed by subjecting the surface of the silicon substrate to an ion-implantation to cause interstitial silicon atoms. The ion may be selected from the group consisting of Ge, N, F, Sb, In, P, As, Ga, He, Ne and Ar. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

The heat treatment may be carried out at a temperature in the range of 700–900° C. Alternatively, the heat treatment is a rapid thermal anneal carried out at a temperature in the range of 900–1150° C. to shorten the time of the anneal.

The shallow diffusion layers have a depth in the range of 10–70 nanometers. The junction depth of the shallow diffusion layers is defined by the depth of the predetermined shallow regions into which crystal defects are introduced. The depth of the predetermined shallow regions is controllable by controlling the ion implantation energy, for which reason the junction depth of the shallow diffusion layers is controllable by controlling the ion implantation energy. The junction depth of the shallow diffusion layers is determined as shallow as possible, however, in consideration of the issue of increase in resistanced the shallow diffusion layers.

The sixth present invention also provides a method of forming a MOS field effect transistor comprising the following steps. A gate electrode is selectively formed on a gate insulation film which is formed on a surface of a silicon substrate. Side wall oxide films are selectively formed at opposite sides of the gate electrode. Impurity-introduced deep regions self-aligned are selectively formed by using the gate electrode and the side wall oxide films as masks. Source/drain diffusion layers are formed by activating the impurity-introduced deep regions. Crystal defects are selectively formed both in a predetermined shallow region and in the source/drain diffusion layers by such an ion-implantation of silicon as to have silicon atoms penetrate through the gate electrode and the side wall oxide films. The predetermined shallow region is positioned in a surface region of the semiconductor substrate under the gate electrode and the side wall oxide films. The predetermined shallow region have a bottom shallower than the source/drain diffusion layers. The semiconductor substrate is subjected to a heat treatment not only to cause a vertical diffusion of an impurity from the source/drain diffusion regions but also to cause a rate-increased lateral diffusion of the impurity from the source/drain diffusion layers through the predetermined shallow region so as to selectively form shallow diffusion layers in the semiconductor substrate under the side wall oxide films, so that the shallow diffusion layers laterally extend from the source/drain diffusion layers and that the shallow diffusion layers have a bottom level shallower than the source/drain diffusion layers.

The crystal defects may be formed by an ion-implantation at a dose slightly lower than a critical dose over which crystal semiconductor is made into amorphous semiconductor. The ion-implantation of silicon is preferably carried out at a dose in the range of $1\times10^{13}$ cm$^{-2}$ to $5\times10^{14}$ cm$^{-2}$. It is more preferable that the ion-implantation of silicon is carried out at a dose of about $1\times10^{14}$ cm$^{-2}$. As the dose of silicon for introducing the crystal defects is increased, the diffusion length or the diffusion rate is increased. If, however, the surface of the semiconductor substrate is made into amorphous state, then the diffusion length drops. This means that increase in the density of crystal defects renders the rate of impurity diffusion increased unless the semiconductor is made into amorphous state.

The crystal defects may be formed by subjecting the surface of the silicon substrate to an ion-implantation to cause interstitial silicon atoms. The ion may be selected from the group consisting of Ge, N, F, Sb, In, P, As, Ga, He, Ne and Ar. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

The heat treatment may be carried out at a temperature in the range of 700–900° C. Alternatively, the heat treatment may be a rapid thermal anneal carried out at a temperature in the range of 900–1150° C. to shorten the time of the anneal.

It is preferable that the shallow diffusion layers have a depth in the range of 10–70 nanometers. The junction depth of the shallow diffusion layers is defined by the depth of the predetermined shallow regions into which crystal defects are introduced. The depth of the predetermined shallow regions is controllable by controlling the ion implantation energy, for which reason the junction depth of the shallow diffusion layers is controllable by controlling the ion implantation energy. The junction depth of the shallow diffusion layers is determined as shallow as possible, however, in consideration of the issue of increased resistance of the shallow diffusion layers.

The seventh present invention also provides a method of forming a MOS field effect transistor comprising the following steps. A gate electrode is selectively formed on a gate insulation film which is formed on a surface of a silicon substrate. Side wall oxide films are selectively formed at opposite sides of the gate electrode. Impurity-introduced silicon films self-aligned is selectively formed on the silicon substrate by using the gate electrode and the side wall oxide films as masks. Crystal defects are selectively formed in predetermined shallow and deep regions by such an ion-implantation of silicon as to have silicon atoms penetrate through the gate electrode and the side wall oxide films. The predetermined shallow region is positioned in a surface region of the semiconductor substrate under the gate electrode and the side wall oxide films. The predetermined deep regions have a bottom level deeper than the predetermined shallow region. The semiconductor substrate is subjected to a heat treatment not only to cause a rate-increased vertical diffusion of an impurity from the impurity-introduced silicon films through the predetermined deep regions so as to selectively form source/drain diffusion layers but also to cause a rate-increased lateral diffusion of the impurity from the impurity-introduced silicon films through the predetermined deep and shallow regions so as to selectively form shallow diffusion layers in the semiconductor substrate under the side wall oxide films, so that the shallow diffusion layers laterally extend from lower portions of the source/drain diffusion layers and that the shallow diffusion layers have a bottom level shallower than the source/drain diffusion layers.

The crystal defects may be formed by an ion-implantation at a dose slightly lower than a critical dose over which crystal semiconductor is made into amorphous semiconductor. The ion-implantation of silicon is preferably carried out at a dose in the range of $1\times10^{13}$ cm$^{-2}$ to $5\times10^{14}$ cm$^{-2}$. It is more preferable that the ion-implantation of silicon is carried out at a dose of about $1\times10^{14}$ cm$^{-2}$. As the dose of silicon for introducing the crystal defects is increased, the diffusion length or the diffusion rate is increased. If, however, the surface of the semiconductor substrate is made into amorphous state, then the diffusion length drops. This means that increase in the density of crystal defects renders the rate of impurity diffusion increased unless the semiconductor is made into amorphous state.

The crystal defects may be formed by subjecting the surface of the silicon substrate to an ion-implantation to cause interstitial silicon atoms. The ion may be selected from the group consisting of Ge, N, F, Sb, In, P, As, Ga, He, Ne and Ar. Such ion other than silicon is implanted in order to flick silicon atoms out from the crystal lattice and generate interstitial silicon atoms flicked. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

The heat treatment may be carried out at a temperature in the range of 700–900° C. Alternatively, the heat treatment may be a rapid thermal anneal carried out at a temperature in the range of 900–1150° C. to shorten the time of the anneal.

It is preferable that the shallow diffusion layers have a depth in the range of 10–70 nanometers. The junction depth of the shallow diffusion layers is defied by the depth of the predetermined shallow regions into which crystal defects are introduced. The depth of the predetermined shallow reason is controllable by controlling the ion implantation energy, for which reason the junction depth of the shallow diffusion layers is controllable by controlling the ion implantation energy. The junction depth of the shallow diffusion layers is determined as shallow as possible, however, in consideration of the issue of increased resistance of the shallow diffusion layers

PREFERRED EMBODIMENTS

A first embodiment according to the present invention will be described with reference to FIGS. 2A through 2D. A method of forming a MOS field effect transistor is provided.

Figure 2A:
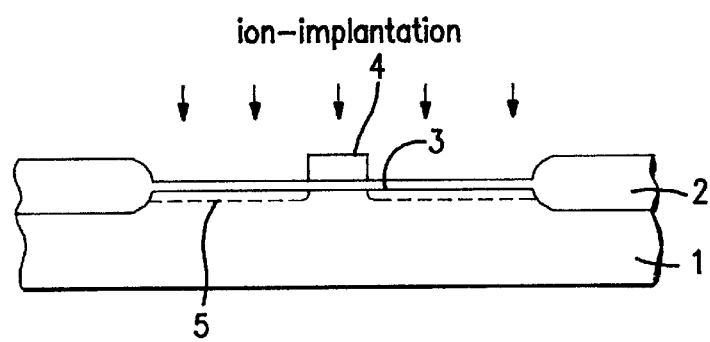
FIGS. 2A through 2D are fragmentary cross sectional elevation views illustrative of silicon substrates involved in a method of forming a MOS field effect transistor with improved shallow diffusion layers laterally extending from source/drain diffusion layers in a first embodiment according to the present invention.

With reference to FIG. 2A, filed oxide films 2 are selectively formed on a surface of a silicon substrate 1 to define an active region. A gate oxide film 3 is formed on an active region of the silicon substrate 1. A gate electrode 4 is selectively formed on the gate insulation film 3. Crystal defects are selectively formed in predetermined shallow regions 5 positioned in a surface region of the semiconductor substrate 1 by using the gate electrode 4 as a mask. The crystal defects are formed by an ion-implantation of silicon into the silicon substrate at a dose in the range of $1\times10^{13}$ cm$^{-2}$ to $5\times10^{14}$ cin$^{-2}$, but more preferably at a dose of about $1\times10^{14}$ cm$^{-2}$. The dose of the silicon implantation for introduction of crystal defects into the predetermined shallow regions 5 is set less than a critical dose over which the crystal silicon of the silicon substrate 1 is made into amorphous silicon. As a result of the selective ion-implantation of silicon into the silicon substrate 1 by use of the gate electrode as a mask, crystal defect introduced shallow regions 5 are selectively formed in the predetermined shallow regions 5 in the silicon substrate 1. The depth of the crystal defect introduced shallow regions 5 is controllable by controlling the ion-implantation energy. The ion-implantation of silicon may be carried out at an energy, for example, not more than 10 keV.

Alternatively, the crystal defects may be formed by subjecting the surface of the silicon substrate to an ion-implantation to cause interstitial silicon atoms. The ions may be selected from the group consisting of Ge, N, F, Sb, In, P, As, Ga, and inert gases, for example, He, Ne and Ar. Such ion other than silicon may be implanted in order to flick silicon atoms out from the crystal lattice and generate interstitial silicon atoms flicked. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

Further, alternatively, the crystal defects may be formed by subjecting the silicon substrate 1 to a plasma atmosphere.

Figure 2B:
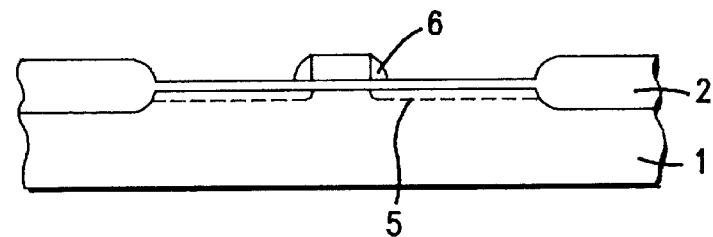

With reference to FIG. 2B, side wall oxide films 6 are selectively formed at opposite sides of the gate electrode 4. The side wall oxide films 6 are required to be formed at a relatively low temperature below a critical temperature, over which the crystal defects are recovered, in order to avoid any recovery of the crystal defects having been introduced by the silicon implantation. The available temperature is in the range of 200–450° C. The width of the side walls 6 is relatively wide, for example, in the range of 50–200 nanometers.

Figure 2C:
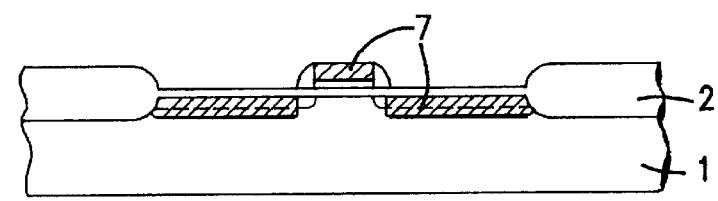

With reference to FIG. 2C, a selective ion-implantation of $BF_2$ is carried out at an energy of 10–20 keV and a dose in the range of $1\times10^{15}$ to $3\times10^{15}$ atoms/cm$^2$ by use of the gate electrode 4 and the side wall oxide films 6 as masks so that impurity-introduced deep regions 7 are selectively formed in an upper region of the gate electrode 4 and also in upper regions of the silicon substrate 1. The impurity-introduced deep regions 7 in the silicon substrate 1 have a bottom level deeper than the above crystal defect introduced shallow regions 5.

Figure 2D:
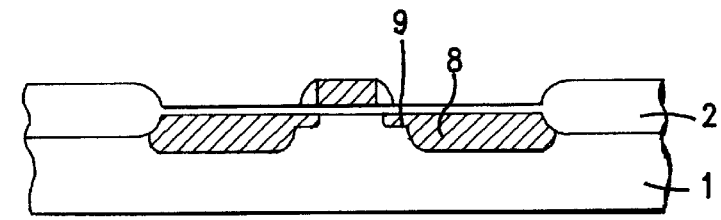

With reference to FIG. 2D, the semiconductor substrate 1 is subjected to a heat treatment at a temperature in the range of 700–900° C. Alternatively, the heat treatment may be a rapid thermal anneal carried out at a temperature in the range of 900–1150° C. to shorten the time of the anneal. As a result of the heat treatment, not only a vertical diffusion of an impurity from the impurity-introduced deep regions 7 is caused so as to selectively form source/drain diffusion layers 8 but also a rate-increased lateral diffusion of the impurity from the impurity-introduced deep regions 7 through the crystal defect introduced shallow regions 9 is caused so as to selectively form shallow diffusion layers 9 in the semiconductor substrate 1 under the side wall oxide films 6. The shallow diffusion layers 9 laterally extend from the source/drain diffusion layers 8. The shallow diffusion layers 9 have a bottom level shallower than the source/drain diffusion layers 8. The shallow diffusion layers 9 have a depth in the range of 10–70 nanometers. The junction depth of the shallow diffusion layers 9 is defined by the depth of the predetermined shallow regions into which crystal defects are introduced. The depth of the predetermined shallow regions is controllable by controlling the ion implantation energy, for which reason the junction depth of the shallow diffusion layers 9 is controllable by controlling the ion implantation energy. The junction depth of the shallow diffusion layers 9 is determined as shallow as possible, however, in consideration of the issue of increased resistance of the shallow diffusion layers 9.

Figure 7:
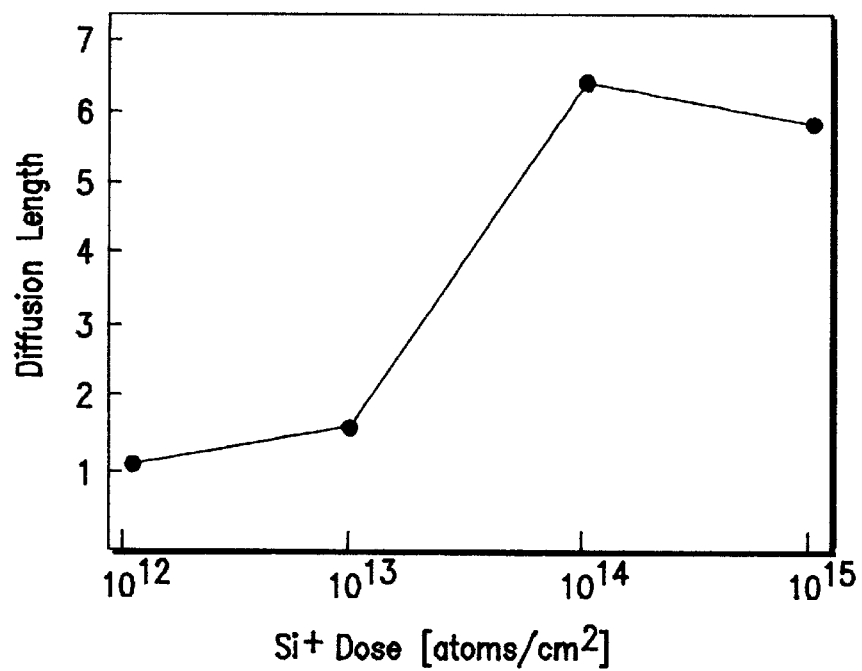
FIG. 7 is a diagram illustrative of variation, over silicon dose, of ratio in diffusion length of a rate-increased boron diffusion when silicon implanted crystal defect region is formed to a boron diffusion when crystal defect free region is formed.

FIG. 7 is illustrative of variation, over silicon dose, of the ratio in diffusion length of a rate-increased boron diffusion when silicon implanted crystal defect region is formed to a boron diffusion when crystal defect free region is formed. Deep p$^+$-diffusion layers are formed, which have a junction depth of 0.15 micrometers. Si$^+$ is implanted at an energy of 120 keV and various doses. An anneal is carried out at a temperature of 800° C. for 10 minutes. As the dose of Si$^+$ for introducing the crystal defects is increased, the diffusion length or the diffusion rate is increased. If, however, the surface of the silicon substrate is made into amorphous silicon, then the diffusion length drops. This means that an increase in the density of crystal defects renders the rate of impurity diffusion increased unless silicon is made into an amorphous state.

A second embodiment according to the present invention will be described with reference to FIGS. 3A through 3D. A method of forming a MOS field effect transistor is provided.

Figure 3A:
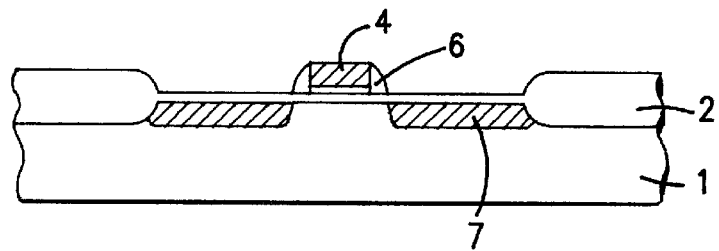
FIGS. 3A through 3D are fragmentary cross sectional elevation views illustrative of silicon substrates involved in a method of forming a MOS field effect transistor with improved shallow diffusion layers laterally extending from source/drain diffusion layers in a second embodiment according to the present invention.

With reference to FIG. 3A, filed oxide films 2 are selectively formed on a surface of a silicon substrate 1 to define an active region. A gate oxide film 3 is formed on an active region of the silicon substrate 1. A gate electrode 4 is selectively formed on the gate insulation film 3. Side wall oxide films 6 are selectively formed at opposite sides of the gate electrode 4. A selective ion-implantation of BF2 is carried out at an energy of 10–20 keV and a dose in the range of $1\times10^{15}$ to $3\times10^{15}$ atoms/cm$^2$ by use of the gate electrode 4 and the side wall oxide films 6 as masks so that impurity-introduced deep regions 7 are selectively formed in an upper region of the gate electrode 4 and also in upper regions of the silicon substrate 1.

Figure 3B:
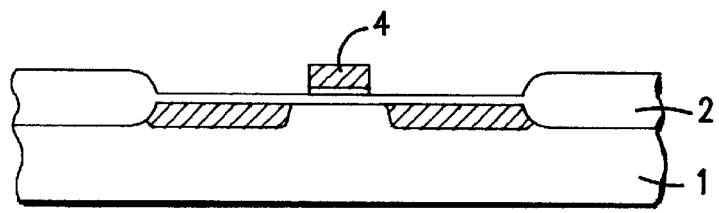

With reference to FIG. 3B, the side wall oxide films 6 are removed.

Figure 3C:
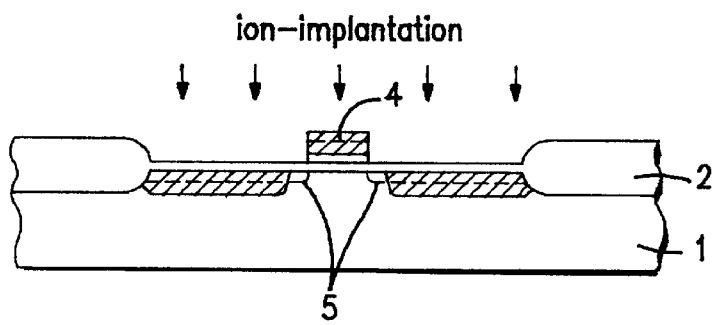

With reference to FIG. 3C, Crystal defects are selectively formed in predetermined shallow regions 5 positioned in a surface region of the semiconductor substrate 1 by using the gate electrode 4 as a mask The predetermined shallow regions or crystal defect introduced regions 5 have a bottom level shallower than the impurity-introduced deep regions 7. The crystal defects are formed by an ion-implantation of silicon into the silicon substrate at a dose in the range of $1\times10^{13}$ cm$^{-2}$ to $5\times10^{14}$ cm$^{-2}$, but more preferably at a dose of about $1\times10^{14}$ cm$^{-2}$. The dose of the silicon implantation for introduction of crystal defects into the predetermined shallow regions 5 is set less than a critical dose over which the crystal silicon of the silicon substrate 1 is made into amorphous silicon. As a result of the selective ion-implantation of silicon into the silicon substrate 1 by use of the gate electrode as a mask, crystal defect introduced shallow regions 5 are selectively formed in the predetermined shallow regions 5 in the silicon substrate 1. The depth of the crystal defect introduced shallow regions 5 is controllable by controlling the ion-implantation energy. The ion-implantation of silicon may be carried out at an energy, for example, not more than 10 keV.

Alternatively, the crystal defects may be formed by subjecting the surface of the silicon substrate to an ion-implantation to cause interstitial silicon atoms. The ion may be selected from the group consisting of Ge, N, F, Sb, In, P, As, Ga, and inert gases, for example, He, Ne and Ar. Such ions other than silicon may be implanted in order to flick silicon atoms out from the crystal lattice and generate interstitial silicon atoms flicked. The flicked silicon atoms form crystal defects. When the atomic weight of the ion is heavier than a silicon atom, the critical dose over which the crystal silicon is made into amorphous silicon is lowered, Namely, when the heavy atom is implanted to cause the interstitial silicon atoms without, however, making the crystal silicon into amorphous silicon, the dose is set lower than when silicon is implanted.

Further, alternatively, the crystal defects may be formed by subjecting the silicon substrate 1 to a plasma atmosphere.

Figure 3D:
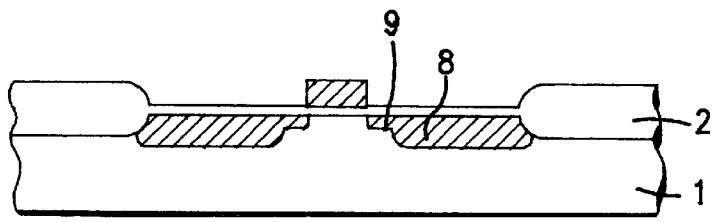

With reference to FIG. 3D, the semiconductor substrate 1 is subjected to a heat treatment at a temperature in the range of 700–900° C. Alternatively, the heat treatment may be a rapid thermal anneal carried out at a temperature in the range of 900–1150° C. to shorten the time of the anneal. As a result of the heat treatment, not only a vertical diffusion of an impurity from the impurity-introduced deep regions 7 is caused so as to selectively form source/drain diffusion layers 8 but also a rate-increased lateral diffusion of the impurity from the impurity-introduced deep regions 7 through the crystal defect introduced shallow regions 9 is caused so as to selectively form shallow diffusion layers 9 in the semiconductor substrate 1 under the side wall oxide films 6. The shallow diffusion layers 9 laterally extend from the source/ drain diffusion layers 8. The shallow diffusion layers 9 have a bottom level shallower than the source/drain diffusion layers 8. The shallow diffusion layers 9 have a depth in the range of 10–70 nanometers. The junction depth of the shallow diffusion layers 9 is defined by the depth of the predetermined shallow regions into which crystal defects are introduced. The depth of the predetermined shallow regions is controllable by controlling the ion implantation energy, for which reason the junction depth of the shallow diffusion layers 9 is controllable by controlling the ion implantation energy. The junction depth of the shallow diffusion layers 9 is determined as shallow as possible, however, in consideration of the issue of increased resistance of the shallow diffusion layers 9.

FIG. 7 is illustrative of variation, over silicon dose, of the ratio in diffusion length of a rate-increased boron diffusion when silicon implanted crystal defect region is formed to a boron diffusion when crystal defect free region is formed. Deep $p^+$-diffusion layers are formed, which have a junction depth of 0.15 micrometers. $Si^+$ is implanted at an energy of 120 keV and various doses. An anneal is carried out at a temperature of 800° C. for 10 minutes. As the dose of $Si^+$ for introducing the crystal defects is increased, the diffusion length or the diffusion rate is increased. If, however, the surface of the silicon substrate is made into amorphous silicon, then the diffusion length drops. This means that increase in the density of crystal defects renders the rate of impurity diffusion increased unless silicon is made into an amorphous state.

A third embodiment according to the present invention will be described with reference to FIGS. 4A through 4C. A method of forming a MOS field effect transistor is provided.

Figure 4A:
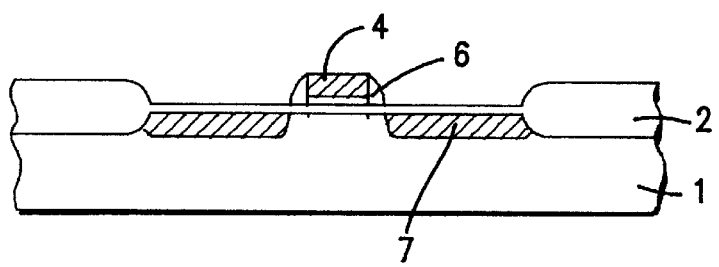
FIGS. 4A through 4C are fragmentary cross sectional elevation views illustrative of silicon substrates involved in a method of forming a MOS field effect transistor with improved shallow diffusion layers laterally extending from source/drain diffusion layers in a third embodiment according to the present invention.

With reference to FIG. 4A, filed oxide films 2 are selectively formed on a surface of a silicon substrate 1 to define an active region. A gate oxide film 3 is formed on an active region of the silicon substrate 1. A gate electrode 4 is selectively formed on the gate insulation film 3. Side wall oxide films 6 are selectively formed at opposite sides of the gate electrode 4. A selective ion-implantation of $BF_2$ is carried out at an energy of 10–20 keV and a dose in the range of $1$–$10^{15}$ to $3 \times 10^{15}$ atoms/cm$^2$ by use of the gate electrode 4 and the side wall oxide films 6 as masks so that impurity-introduced deep regions 7 are selectively formed in an upper region of the gate electrode 4 and also in upper regions of the silicon substrate 1.

Figure 4B:
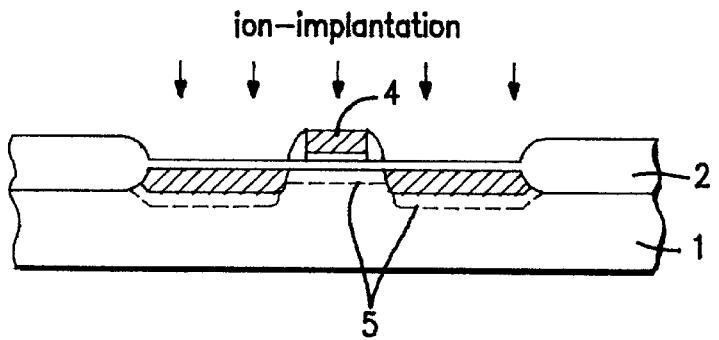

With reference to FIG. 4B, crystal defects are selectively formed in predetermined shallow regions 5 positioned in a surface region of the semiconductor substrate 1 by an ion-implantation of silicon as to have silicon atoms penetrate through the gate electrode and the side wall oxide films The predetermined shallow region 5 is positioned in a surface region of the silicon substrate 1 under the gate electrode 4 and the side wall oxide films 6. The predetermined shallow region 5 below the gate electrode 4 have a bottom shallower than the impurity-introduced deep regions 7. The predetermined deep regions 5 have bottoms positioned under the impurity-introduced deep regions 7. This ion-implantation of silicon into the silicon substrate 1 is carried out at a dose in the range of $1 \times 10^{13}$ cm$^{-2}$ to $5 \times 10^{14}$ cm$^{-2}$, but more preferably at a dose of about $1 \times 10^{14}$ cm$^{-2}$. The dose of the silicon implantation for introduction of crystal defects into the predetermined shallow regions S is set less than a critical dose over which the crystal silicon of the silicon substrate 1 is made into amorphous silicon. As a result of the selective ion-implantation of silicon into the silicon substrate 1 by use of the gate electrode as a mask, crystal defect introduced shallow regions 5 are selectively formed in the predetermined shallow regions 5 in the silicon substrate 1. The depth of the crystal defect introduced shallow regions 5 is controllable by controlling the ion-implantation energy. The ion-implantation of silicon may be carried out at an energy, for example, not more than 10 keV.

Alternatively, the crystal defects may be formed by subjecting the surface of the silicon substrate to an ion-implantation to cause interstitial silicon atoms. The ion way be selected from the group consisting of Ge, N, F, Sb, In, P, As, Ga, and inert gases, for example, He, Ne and Ar. Such ions other than silicon may be implanted in order to flick silicon atoms out from the crystal lattice and generate interstitial silicon atoms flicked. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

Further, alternatively, the crystal defects may be formed by subjecting the silicon substrate 1 to a plasma atmosphere.

Figure 4C:
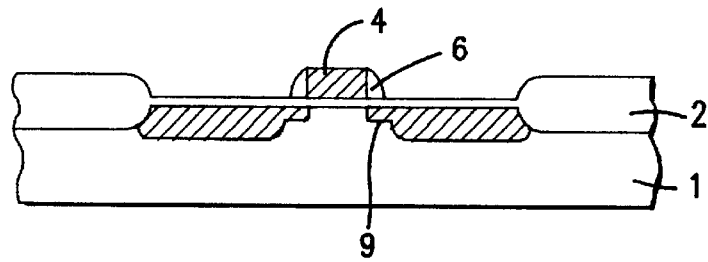

With reference to FIG. 4C, the silicon substrate 1 is subjected to a heat treatment at a temperature in the range of 700–900° C. Alternatively, the heat treatment may be a rapid thermal anneal carried out at a temperature in the range of 900–1150° C. to shorten the time of the anneal. As a result of the heat treatment, not only a rate-increased vertical diffusion of an impurity from the impurity-introduced deep regions 7 is caused so as to selectively form source/drain diffusion layers 8 but also a rate-increased lateral diffusion of the impurity from the impurity-introduced deep regions 7 through the crystal defect introduced shallow regions 9 is caused so as to selectively form shallow diffusion layers 9 in the silicon substrate 1 under the side wall oxide films 6. The shallow diffusion layers 9 laterally extend from the source/drain diffusion layers 8. The shallow diffusion layers 9 have a bottom level shallower than the source/drain diffusion layers 8. The shallow diffusion layers 9 have a depth in the range of 10–70 nanometers. The junction depth of the shallow diffusion layers 9 is defined by the depth of the predetermined shallow regions into which crystal defects are introduced. The depth of the predetermined shallow regions is controllable by controlling the ion implantation energy, for which reason the junction depth of the shallow diffusion layers 9 is controllable by controlling the ion implantation energy. The junction depth of the shallow diffusion layers 9 is determined as shallow as possible, however, in consideration of the issue of increase in resistanced the shallow diffusion layers 9.

FIG. 7 is illustrative of variation, over silicon dose, of the ratio in diffusion length of a rate-increased boron diffusion when silicon implanted crystal defect region is formed to a boron diffusion when crystal defect free region is formed. Deep $p^+$-diffusion layers are formed, which have a junction depth of 0.15 micrometers. $Si^+$ is implanted at an energy of 120 keV and various doses. An anneal is carried out at a temperature of 800° C. for 10 minutes. As the dose of $Si^+$ for introducing the crystal defects is increased, the diffusion length or the diffusion rate is increased. If, however, the surface of the silicon substrate is made into amorphous silicon, then the diffusion length drops. This means that increase in the density of crystal defects renders the rate of impurity diffusion increased unless silicon is made into an amorphous state.

A fourth embodiment according to the present invention will be described with reference to FIGS. 5A through 5C. A method of forming a MOS field effect transistor is provided.

Figure 5A:
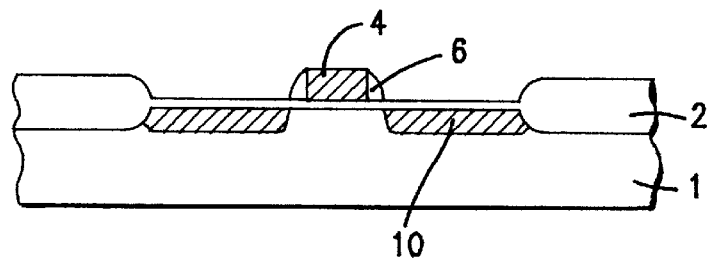
FIGS. 5A through 5C are fragmentary cross sectional elevation views illustrative of silicon substrates involved in a method of forming a MOS field effect transistor with improved shallow diffusion layers laterally extending from source/drain diffusion layers in a fourth embodiment according to the present invention.

With reference to FIG. 5A, filed oxide films 2 are selectively formed on a surface of a silicon substrate 1 to define an active region. A gate oxide film 3 is formed on an active region of the silicon substrate 1. A gate electrode 4 is selectively formed on the gate insulation film 3. Side wall oxide films 6 are selectively formed at opposite sides of the gate electrode 4. A selective ion-implantation of $BF_2$ is carried out at an energy of 10–20 keV and a dose in the range of $1 \times 10^{15}$ to $3 \times 10^{15}$ atoms/cm$^2$ by use of the gate electrode 4 and the side wall oxide films 6 as masks so that impurity-introduced deep regions are selectively formed in an upper region of the gate electrode 4 and also in upper regions of the silicon substrate 1. Source/drain diffusion layers 10 are formed by activating the impurity-introduced deep regions.

Figure 5B:
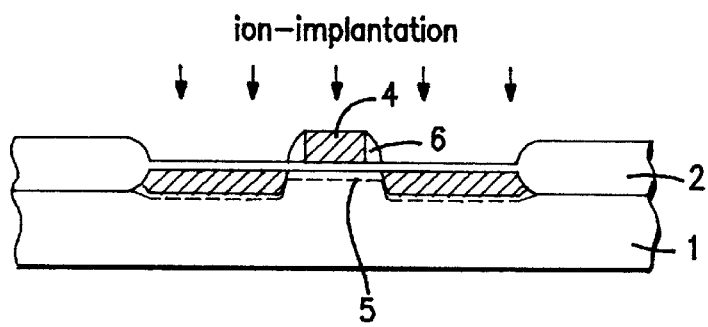
Figure 5C:
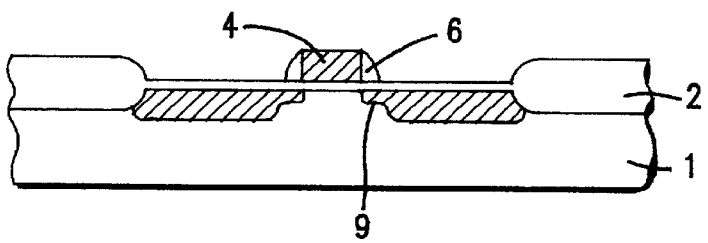

With reference to FIG. 5B, crystal defects are selectively formed in predetermined shallow regions 5 positioned in a surface region of the semiconductor substrate 1 by an ion-implantation of silicon as to have silicon atoms penetrate through the gate electrode 4 and the side wall oxide films 6. The predetermined shallow region 5 is positioned in a surface region of the silicon substrate 1 under the gate electrode 4 and the side wall oxide films 6. The predetermined shallow region 5 have a bottom shallower than the source/drain diffusion layers 10. The predetermined deep regions 5 have bottoms positioned under the source/drain diffusion layers 10. This ion-implantation of silicon into the silicon substrate 1 is carried out at a dose in the range of $1 \times 10^{13}$ cm$^2$ to $5 \times 10^{14}$ cm$^{-2}$, but more preferably at a dose of about $1 \times 10^{14}$ cm$^{-2}$. The dose of the silicon implantation for introduction of crystal defects into the predetermined shallow regions 5 is set less than a critical dose over which the crystal silicon of the silicon substrate 1 is made into amorphous silicon. As a result of the selective ion-implantation of silicon into the silicon substrate 1 by use of the gate electrode as a mask, crystal defect introduced shallow regions 5 are selectively formed in the predetermined shallow regions 5 in the silicon substrate 1. The depth of the crystal defect introduced shallow regions 5 is controllable by controlling the ion-implantation energy. The ion-implantation of silicon may be carried out at an energy, for example, not more than 10 keV.

Alternatively, the crystal defects may be formed by subjecting the surface of the silicon substrate to an ion-implantation to cause interstitial silicon atoms. The ion may be selected from the group consisting of Ge, N, F, Sb, In, P, As, Ga, and inert gases, for example, He, Ne and Ar. Such ions other than silicon may be implanted in order to flick silicon atoms out from the crystal lattice and generate interstitial silicon atoms flicked. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

Further, alternatively, the crystal defects may be formed by subjecting the silicon substrate 1 to a plasma atmosphere.

With reference to FTG. 5C, the silicon substrate 1 is subjected to a heat treatment at a temperature in the range of 700–900° C. Alternatively, the heat treatment may be a rapid thermal anneal carried out at a temperature in the range of 900–1150° C. to shorten the time of the anneal. As a result of the heat treatment, not only a rate-increased vertical diffusion of an impurity from the source/drain diffusion layers 10 is caused so as to further diffuse the source/drain diffusion layers 10 but also a rate-increased lateral diffusion of the impurity from the source/drain diffusion layers 10 through the crystal defect introduced shallow regions 9 is caused so as to selectively form shallow diffusion layers 9 in the silicon substrate 1 under the side wall oxide films 6 The shallow diffusion layers 9 laterally extend from the source/drain diffusion layers 10. The shallow diffusion layers 9 have a bottom level shallower than the source/drain diffusion layers 10. The shallow diffusion layers 9 have a depth in the range of 10–70 nanometers. The junction depth of the shallow diffusion layers 9 is defined by the depth of the predetermined shallow regions into which crystal defects are introduced. The depth of the predetermined shallow regions is controllable by controlling the ion implantation energy, for which reason the junction depth of the shallow diffusion layers 9 is controllable by controlling the ion implantation energy. The junction depth of the shallow diffusion layers 9 is. determined as shallow as possible, however, in consideration of the issue of increased resistance of the shallow diffusion layers 9.

FIG. 7 is illustrative of variation, over silicon dose, of the ratio in diffusion length of a rate-increased boron diffusion when silicon implanted crystal defect region is formed to a boron diffusion when crystal defect free region is formed. Deep p$^+$-diffusion layers are formed, which have a junction depth of 0.15 micrometers. Si$^+$ is implanted at an energy of 120 keV and various doses. An anneal is carried out at a temperature of 800° C. for 10 minutes. As the dose of Si$^+$ for introducing the crystal defects is increased, the diffusion length or the diffusion rate is increased. If, however, the surface of the silicon substrate is made into amorphous silicon, then the diffusion length drops. This means that an increase in the density of crystal defects renders the rate of impurity diffusion increased unless silicon is made into an amorphous state.

A fifth embodiment according to the present invention will be described with reference to FIGS. 6A through 6C. A method of forming a MOS field effect transistor is provided.

Figure 6A:
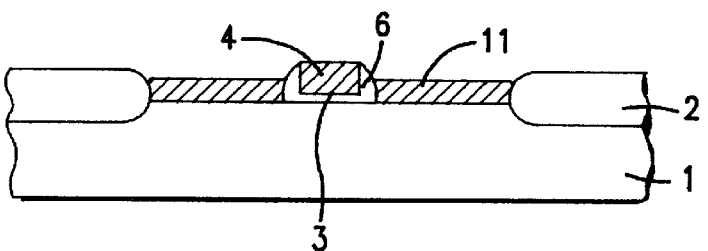
FIGS. 6A through 6C are fragmentary cross sectional elevation views illustrative of silicon substrates involved in a method of forming a MOS field effect transistor with improved shallow diffusion layers laterally extending from source/drain diffusion layers in a fifth embodiment according to the present invention.

With reference to FIG. 6A, filed oxide films 2 are selectively formed on a surface of a silicon substrate 1 to define an active region. A gate oxide film 3 is formed on an active region of the silicon substrate 1. A gate electrode 4 is selectively formed on the gate insulation film 3. Side wall oxide films 6 are selectively formed at opposite sides of the gate electrode 4. Boron-introduced silicon films 11 self-aligned are selectively formed on the silicon substrate 1 by using the gate electrode 4 and the side wall oxide films 6 as masks.

Figure 6B:
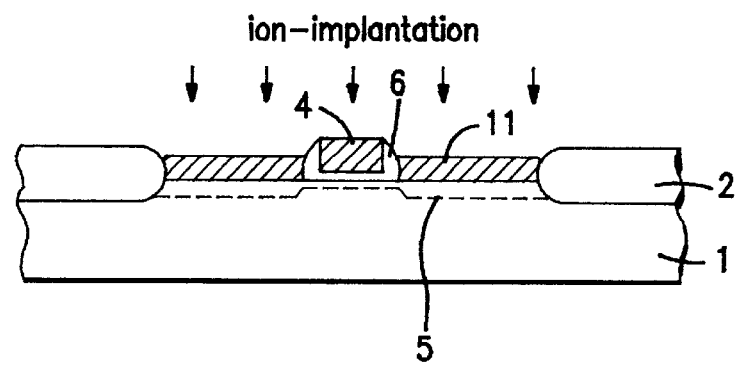

With reference to FIG. 6B, crystal defects are selectively formed in predetermined shallow and deep regions 5 by such an ion-implantation of silicon as to have silicon atoms penetrate through the gate electrode 4 and the side wall oxide films 6. The predetermined shallow region 5 is positioned in a surface region of the silicon substrate 1 under the gate electrode 4 and the side wall oxide films 6. The predetermined deep regions 5 have a bottom level deeper than the predetermined shallow region 5. This ion-implantation of silicon into the silicon substrate 1 is carried out at a dose in the range of $1 \times 10^{13}$ cm$^{-2}$ to $5 \times 10^{14}$ cm$^{-2}$, but more preferably at a dose of about $1 \times 10^{14}$ cm$^{-2}$. The dose of the silicon implantation for introduction of crystal defects into the predetermined shallow regions 5 is set less than a critical dose over which the crystal silicon of the silicon substrate 1 is made into amorphous silicon. As a result of the selective ion-implantation of silicon into the silicon substrate 1 by use of the gate electrode as a mask, crystal defect introduced shallow regions 5 are selectively formed in the predetermined shallow regions 5 in the silicon substrate 1. The depth of the crystal defect introduced shallow regions 5 is controllable by controlling the ion-implantation energy. The ion-implantation of silicon may be carried out at an energy, for example, not more than 10 keV.

Alternatively, the crystal defects may be formed by subjecting the surface of the silicon substrate to an ion-implantation to cause interstitial silicon atoms. The ion may be selected from the group consisting of Ge, N, F, Sb, In, P, As, Ga, and inert gases, for example, He, Ne and Ar. Such ion other than silicon may be implanted in order to flick silicon atoms out from the crystal lattice and generate interstitial silicon atoms flicked. The flicked silicon atoms form crystal defects. When the atomic weight of the ion is heavier than a silicon atom, the critical dose over which the crystal silicon is made into amorphous silicon is lowered. Namely, when the heavy atom is implanted to cause the interstitial silicon atoms without, however, making the crystal silicon into amorphous silicon, the dose is set lower than when silicon is implanted.

Further, alternatively, the crystal defects may be formed by subjecting the silicon substrate 1 to a plasma atmosphere.

Figure 6C:
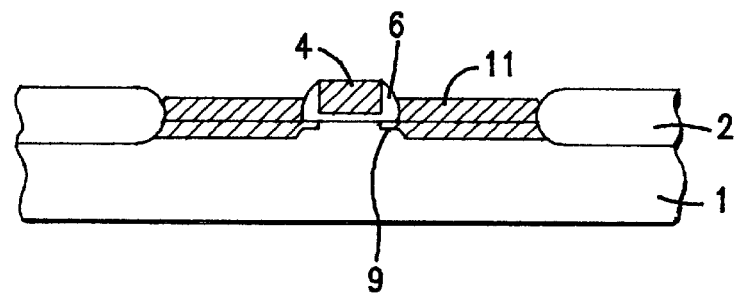

With reference to FIG. 6C, the silicon substrate 1 is subjected to a heat treatment at a temperature in the range of 700–900° C. Alternatively, the heat treatment may be a rapid thermal anneal carried out at a temperature in the range of 900–1150° C. to shorten the time of the anneal. As a result of the heat treatment, not only a rate-increased vertical diffusion of an impurity from the boron-introduced silicon layers 11 is caused so as to form the source/drain diffusion layers 11 but also a rate-increased lateral diffusion of the impurity from the source/drawn diffusion layers 10 through the crystal defect introduced shallow regions 9 is caused so as to selectively form shallow diffusion layers 9 in the silicon substrate 1 under the side wall oxide films 6. The shallow diffusion layers 9 laterally extend from the source/drain diffusion layers 11. The shallow diffusion layers 9 have a bottom level shallower than the source/drain diffusion layers 11. The shallow diffusion layers 9 have a depth in the range of 10–70 nanometers. The junction depth of the shallow difffusion layers 9 is defined by the depth of the predetermined shallow regions into which crystal defects are introduced. The depth of the predetermined shallow regions is controllable by controlling the ion implantation energy, for which reason the junction depth of the shallow diffusion layers 9 is controllable by controlling the ion implantation energy. The junction depth of the shallow diffusion layers 9 is determined as shallow as possible, however, in consideration of the issue of increase in resistance the shallow diffusion layers 9.

PIG. 7 is illustrative of variation, over silicon dose, of the ratio in diffusion length of a rate-increased boron diffusion when silicon implanted crystal defect region is formed to a boron diffusion when crystal defect free region is formed. Deep p$^+$-diffusion layers are formed, which have a junction depth of 0.15 micrometers. Si$^+$ is implanted at an energy of 120 keV and various doses. An anneal is carried out at a temperature of 800° C. for 10 minutes. As the dose of Si$^+$ for introducing the crystal defects is increased, the diffusion length or the diffusion rate is increased. If, however, the surface of the silicon substrate is made into amorphous silicon, then the diffusion length drops. This means that an increase in the density of crystal defects renders the rate of impurity diffusion increased unless silicon is made into an amorphous state.

Whereas modifications of the present invention will be apparent o a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of forming shallow diffusion layers in a semiconductor substrate, said shallow diffusion layers being positioned in the vicinity of edge portions of a gate electrode, said shallow diffusion layers laterally extending from source/drain diffusion layers having a bottom level deeper than said shallow diffusion layers, and said method comprising the steps of:

selectively forming crystal defects, by ion-implantation without amorphizing the semiconductor substrate at a dose rate from $1\times10^{14}$ cm$^{-2}$ to about $5\times10^{14}$ cm$^{-2}$, at least in predetermined shallow regions positioned in a surface region of said semiconductor substrate and in the vicinity of said edge portions of said gate electrode, said predetermined shallow regions being laterally in contact with impurity-introduced deep regions having been formed, and said predetermined shallow regions having a bottom level shallower than said impurity-introduced deep regions; and subjecting said semiconductor substrate to a heat treatment not only to cause a vertical diffusion of an impurity from said impurity-introduced regions so as to selectively form said source/drain diffusion layers but also to cause a rate-increased lateral diffusion of said impurity from said impurity-introduced regions through said predetermined shallow regions so as to selectively form said shallow diffusion layers.

2. The method as claimed in claim 1, wherein said crystal defects are formed by subjecting said substrate to a plasma atmosphere.

3. The method as claimed in claim 1, wherein said semiconductor substrate is a silicon substrate and said crystal defects are formed by an ion-implantation of silicon into said silicon substrate.

4. The method as claimed in claim 3, wherein said ion-implantation of silicon is carried out at a dose of about $1\times10^{14}$ cm$^{-2}$.

5. The method as claimed in claim 1, wherein said semiconductor substrate is a silicon substrate and said crystal defects are formed by subjecting said surface of said silicon substrate to an ion-implantation to cause interstitial silicon atoms.

6. The method as claimed in claim 1, wherein said ion-implantation is with an ion selected from the group consisting of N, F, Sb, In, P, As, Ga, He, Ne and Ar.

7. The method as claimed in claim 1, wherein said heat treatment is carried out at a temperature in the range of 700–900° C.

8. The method as claimed in claim 1, wherein said heat treatment is a rapid thermal anneal carried out at a temperature in the range of 900–1150° C.

9. The method as claimed in claim 1, wherein said shallow diffusion layers have a depth in the range of 10–70 nanometers.

10. A method of forming shallow diffusion layers in a semiconductor substrate, said shallow diffusion layers being positioned in the vicinity of edge portions of a gate electrode, said shallow diffusion layers laterally extending from source/drain diffusion layers having a bottom level deeper than said shallow diffusion layers, and said method comprising the steps of:

selectively forming crystal defects, by ion-implantation without amorphizing the semiconductor substrate at a dose rate from $1\times10^{14}$ cm$^{-2}$ to about $5\times10^{14}$ cm$^{-2}$, at least in predetermined shallow regions positioned in a surface region of said semiconductor substrate and in the vicinity of said edge portions of said gate electrode;

selectively forming impurity-introduced deep regions laterally in contact with said predetermined shallow regions, and said impurity-introduced deep regions having a bottom level deeper than said predetermined shallow regions; and subjecting said semiconductor substrate to a heat treatment not only to cause a vertical diffusion of an impurity from said impurity-introduced regions so as to selectively form said source/drain diffusion layers but also to cause a rate-increased lateral diffusion of said impurity from said impurity-introduced regions through said predetermined shallow regions so as to selectively form said shallow diffusion layers.

11. The method as claimed in claim 10, wherein said crystal defects are formed by subjecting said substrate to a plasma atmosphere.

12. The method as claimed in claim 10, wherein said semiconductor substrate is a silicon substrate and said crystal defects are formed by ion-implantation of silicon into said silicon substrate.

13. The method as claimed in claim 12, wherein said ion-implantation of silicon is carried out at a dose lower than a critical dose over which crystal silicon is made into amorphous silicon.

14. The method as claimed in claim 12, wherein said ion-implantation of silicon is carried out at a dose of about $1\times10^{14}$ cm$^{-2}$.

15. The method as claimed in claim 10, wherein said ion-implantation is with an ion selected from the group consisting of N, F, Sb, In, P, As, Ga, He, Ne and Ar.

16. The method as claimed in claim 10, wherein said heat treatment is carried out at a temperature in the range of 700–900° C.

17. The method as claimed in claim 10, wherein said heat treatment is a rapid thermal anneal carried out at a temperature in the range of 900–1150° C.

18. The method as claimed in claim 10, wherein said shallow diffusion layers have a depth in the range of 10–70 nanometers.

19. A method of forming a MOS field effect transistor comprising the steps of:

selectively forming a gate electrode on a gate insulation film which is formed on a surface of a silicon substrate;

selectively forming crystal defects, by ion-implantation without amorphizing the semiconductor substrate at a dose rate from $1\times10^{14}$ cm$^{-2}$ to about $5\times10^{4}$ cm$^{-2}$, in predetermined shallow regions positioned in a surface region of said semiconductor substrate by using said gate electrode as a mask;

selectively forming side wall oxide films at opposite sides of said gate electrode;

selectively forming impurity-introduced deep regions having a bottom level deeper than said predetermined shallow regions by an ion implantation using said gate electrode and said side wall oxide films as masks; and subjecting said semiconductor substrate to a heat treatment not only to cause a vertical diffusion of an impurity from said impurity-introduced regions so as to selectively form source/drain diffusion layers but also to cause a rate-increased lateral diffusion of said impurity from said impurity-introduced regions through said predetermined shallow regions so as to selectively form shallow diffusion layers in said semiconductor substrate under said side wall oxide films, so that said shallow diffusion layers laterally extend from said source/drain diffusion layers and that said shallow diffusion layers have a bottom level shallower than said source/drain diffusion layers.

20. The method as claimed in claim 19, wherein said side wall oxide films are formed at a temperature below a critical temperature over which said crystal defects are recovered.

21. The method as claimed in claim 20, wherein said side wall oxide films are formed at a temperature in the range of 200–450° C.

22. The method as claimed in claim 19, wherein said crystal defects are formed by ion-implantation of silicon into said silicon substrate.

23. The method as claimed in claim 22, wherein said ion-implantation of silicon is carried out at a dose of about $1\times10^{14}$ cm$^{-2}$.

24. The method as claimed in claim 19, wherein said crystal defects are formed by subjecting said surface of said silicon substrate to an ion-implantation to cause interstitial silicon atoms.

25. The method as claimed in claim 19, wherein said ion-implantation is with an ion selected from the group consisting of N, F, Sb, In, P, As, Ga, He, Ne and Ar.

26. The method as claimed in claim 19, wherein said heat treatment is carried out at a temperature in the range of 700–900° C.

27. The method as claimed in claim 19, wherein said heat treatment is a rapid thermal anneal carried out at a temperature in the range of 900–1150° C.

28. The method as claimed in claim 19, wherein said shallow diffusion layers have a depth in the range of 10–70 nanometers.

29. A method of forming a MOS field effect transistor comprising the steps of:

selectively forming a gate electrode on a gate insulation film which is formed on a surface of a silicon substrate;

selectively forming side wall oxide films at opposite sides of said gate electrode;

selectively forming impurity-introduced deep regions by an ion implantation using gate electrode and said side wall oxide films as masks;

removing said side wall oxide films;

selectively forming crystal defects, by ion-implantation without amorphizing the semiconductor substrate at a dose rate from $1\times10^{14}$ cm$^{-2}$ to about $5\times10^{14}$ cm$^{-2}$, in predetermined shallow regions positioned in a surface region of said semiconductor substrate by using said gate electrode as a mask, said predetermined shallow regions having a bottom level shallower than said impurity-introduced deep regions; and subjecting said semiconductor substrate to a heat treatment not only to cause a vertical diffusion of an impurity from said impurity-introduced regions so as to selectively form source/drain diffusion layers but also to cause a rate-increased lateral diffusion of said impurity from said impurity-introduced regions through said predetermined shallow regions so as to selectively form shallow diffusion layers in said semiconductor substrate under said side wall oxide films, so that said shallow diffusion layers laterally extend from said source/drain diffusion layers and that said shallow diffusion layers have a bottom level shallower than said source/drain diffusion layers.

30. The method as claimed in claim 29, wherein said crystal defects are formed by an ion-implantation of silicon into said silicon substrate.

31. The method as claimed in claim 30, wherein said ion-implantation of silicon is carried out at a dose of about $1\times10^{14}$ cm$^{-2}$.

32. The method as claimed in claim 29, wherein said crystal defects are formed by subjecting said surface of said silicon substrate to an ion-implantation to cause interstitial silicon atoms.

33. The method as claimed in claim 29, wherein said ion-implantation is with an ion selected from the group consisting of N, F, Sb, In, P, As, Ga, He, Ne and Ar.

34. The method as claimed in claim 29, wherein said heat treatment is carried out at a temperature in the range of 700–900° C.

35. The method as claimed in claim 29, wherein said heat treatment is a rapid thermal anneal carried out at a temperature in the range of 900–1150° C.

36. The method as claimed in claim 29, wherein said shallow diffusion layers have a depth in the range of 10–70 nanometers.

37. A method of forming a MOS field effect transistor comprising the steps of:
   selectively forming a gate electrode on a gate insulation film which is formed on a surface of a silicon substrate;
   selectively forming side wall oxide films at opposite sides of said rate electrode;
   selectively forming impurity-introduced deep regions by an ion-implantation using said gate electrode and said side wall oxide films as masks;
   selectively forming crystal defects in predetermined shallow and deep regions by such an ion-implantation as to have atoms penetrate through said gate electrode and said side wall oxide films, said predetermined shallow region being positioned in a surface region of said semiconductor substrate under said gate electrode and said side wall oxide films, said predetermined shallow region having a bottom shallower than said impurity-introduced deep regions, said predetermined deep regions having bottoms positioned under said impurity-introduced deep regions; and
   subjecting said semiconductor substrate to a heat treatment not only to cause a rate-increased vertical diffusion of an impurity from said impurity-introduced regions through said predetermined deep regions so as to selectively form source/drain diffusion layers but also to cause a rate-increased lateral diffusion of said impurity from said impurity-introduced regions through said predetermined shallow region so as to selectively form shallow diffusion layers in said semiconductor substrate under said side wall oxide films, so that said shallow diffusion layers laterally extend from said source/drain diffusion layers and that said shallow diffusion layers have a bottom level shallower than said source/drain diffusion layers.

38. The method as claimed in claim 37, wherein said crystal defects are formed by an ion-implantation at a dose slightly lower than a critical dose over which crystal semiconductor is made into amorphous semiconductor.

39. The method as claimed in claim 37, wherein said crystal defects are formed by subjecting said surface of said silicon substrate to an ion-inplantation to cause interstitial silicon atoms.

40. The method as claimed in claim 39, wherein said ion is one selected from the group consisting of Ge, N, F, Sb, In, P, As, Ga, He, Ne and Ar.

41. The method as claimed in claim 37, wherein said heat treatment is carried out at a temperature in the range of 700–900° C.

42. The method as claimed in claim 37, wherein said heat treatment is a rapid thermal anneal carried out at a temperature in the range of 900–1150° C.

43. The method as claimed in claim 37, wherein said shallow diffusion layers have a depth in the range of 10–70 nanometers.

44. The method of claim 37, wherein said ion-implantation is with silicon.

45. The method as claimed in claim 44, wherein said ion-implantation of silicon is carried out at a dose in the range of $1\times10^{13}$ cm$^{-2}$ to $5\times10^{14}$ cm$^{-2}$.

46. The method as claimed in claim 44, wherein said ion-implantation of silicon is carried out at a dose of about $1\times10^{14}$ cm$^{-2}$.

47. A method of forming a MOS field effect transistor comprising the steps of:
   selectively forming a gate electrode on a gate insulation film which is formed on a surface of a silicon substrate;
   selectively forming side wall oxide films at opposite sides of said gate electrode;
   selectively forming impurity-introduced deep regions self-aligned by using said gate electrode and said side wall oxide films as masks;
   forming source/drain diffusion layers by activating said impurity-introduced deep regions;
   selectively forming crystal defects both in a predetermined shallow region and in said source/drain diffusion layers by such an ion-implantation as to have atoms penetrate through said gate electrode and said side wall oxide films, said predetermined shallow region being positioned in a surface region of said semiconductor substrate under said gate electrode and said side wall oxide films, said predetermined shallow region having a bottom shallower than said source/drain diffusion layers; and
   subjecting said semiconductor substrate to a heat treatment not only to cause a vertical diffusion of an impurity from said source/drain diffusion regions but also to cause a rate-increased lateral diffusion of said impurity from said source/drain diffusion layers through said predetermined shallow region so as to selectively form shallow diffusion layers in said semiconductor substrate under said side wall side films, so that said shallow diffusion layers laterally extend from said source/drain diffusion layers and that said shallow diffusion layers have a bottom level shallower than said source/drain diffusion layers.

48. The method as claimed in claim 47, wherein said crystal defects are formed by an ion-implantation at a dose slightly lower than a critical dose over which crystal semiconductor is made into amorphous semiconductor.

49. The method as claimed in claim 47, wherein said crystal defects are formed by subjecting said surface of said silicon substrate to an ion-implantation to cause interstitial silicon atoms.

50. The method as claimed in claim 49, wherein said ion is one selected from the group consisting of Ge, N, F, Sb, In, P, As, Ga, He, Ne and Ar.

51. The method as claimed in claim 47, wherein said heat treatment is carried out at a temperature in the range of 700–900° C.

52. The method as claimed in claim 47, wherein said heat treatment is a rapid thermal anneal carried out at a temperature in the range of 900–1150° C.

53. The method as claimed in claim 47, wherein said shallow diffusion layers have a depth in the range of 10–70 nanometers.

54. The method of claim 47, wherein said ion-implantation is with silicon.

55. The method as claimed in claim 54, wherein said ion-implantation of silicon is carried out at a dose in the range of $1\times10^{13}$ cm$^{-2}$ to $5\times10^{14}$ cm$^{-2}$.

56. The method as claimed in claim 54, wherein said ion-implantation of silicon is carried out at a dose of about $1\times10^{14}$ cm$^{-2}$.

57. A method of forming a MOS field effect transistor comprising the steps of:

selectively forming a gate electrode on a gate insulation film which is formed on a surface of a silicon substrate;

selectively forming side wall oxide films at opposite sides of said gate electrode;

selectively forming impurity-introduced silicon films self-aligned on said silicon substrate by using said gate electrode and said side wall oxide films as masks;

selectively forming crystal defects in predetermined shallow and deep regions by such an ion-implantation as to have atoms penetrate through said gate electrode and said side wall oxide films, said predetermined shallow region being positioned in a surface region of said semiconductor substrate under said gate electrode and said side wall oxide films, said predetermined deep regions having a bottom level deeper than said predetermined shallow region; and subjecting said semiconductor substrate to a heat treatment not only to cause a rate-increased vertical diffusion of an impurity from said impurity-introduced silicon films through said predetermined deep regions so as to selectively form source/drain diffusion layers but also to cause a rate-increased lateral diffusion of said impurity from said impurity-introduced silicon films through said predetermined deep and shallow regions so as to selectively form shallow diffusion layers in said semiconductor substrate under said side wall oxide films, so that said shallow diffusion layers laterally extend from lower portions of said source/drain diffusion layers and that said shallow diffusion layers have a bottom level shallower than said source/drain diffusion layers.

58. The method as claimed in claim 57, wherein said crystal defects are formed by an ion-implantation at a dose slightly lower than a critical dose over which crystal semiconductor is made into amorphous semiconductor.

59. The method as claimed in claim 57, wherein said crystal defects are formed by subjecting said surface of said silicon substrate to an ion-implantation to cause interstitial silicon atoms.

60. The method as claimed in claim 59, wherein said ion is one selected from the group consisting of Ge, N, F, Sb, In, P, As, Ga, He, Ne and Ar.

61. The method as claimed in claim 57, wherein said heat treatment is carried out at a temperature in the range of 700–900° C.

62. The method as claimed in claim 57, wherein said heat treatment is a rapid thermal anneal carried out at a temperature in the range of 900–1150° C.

63. The method as claimed in claim 57, wherein said shallow diffusion layers have a depth in the range of 10–70 nanometers.

64. The method of claim 57, wherein said ion-implantation is with silicon.

65. The method as claimed in claim 64, wherein said ion-implantation of silicon is carried out at a dose in the range of $1\times10^{13}$ cm$^{-2}$ to $5\times10^{14}$ cm$^{-2}$.

66. The method as claimed in claim 64, wherein said ion-implantation of silicon is carried out at a dose of about $1\times10^{14}$ cm$^{-2}$.

* * * * *